(12) United States Patent
Chang et al.

(10) Patent No.: US 10,424,266 B2
(45) Date of Patent: Sep. 24, 2019

(54) GATE DRIVING CIRCUIT AND DISPLAY DEVICE USING THE SAME

(71) Applicant: LG Display Co., Ltd., Seoul (KR)

(72) Inventors: Sung Wook Chang, Goyang-si (KR); Se Wan Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 220 days.

(21) Appl. No.: 15/603,024

(22) Filed: May 23, 2017

(65) Prior Publication Data

US 2018/0151146 A1 May 31, 2018

(30) Foreign Application Priority Data

Nov. 30, 2016 (KR) .................. 10-2016-0162184
Dec. 29, 2016 (KR) .................. 10-2016-0182533

(51) Int. Cl.
| | |
|---|---|
| *G11C 19/00* | (2006.01) |
| *G09G 3/36* | (2006.01) |
| *G09G 3/20* | (2006.01) |
| *G11C 19/28* | (2006.01) |
| *G09G 3/3266* | (2016.01) |

(52) U.S. Cl.
CPC ......... *G09G 3/3696* (2013.01); *G09G 3/2003* (2013.01); *G09G 3/3266* (2013.01); *G09G 3/3677* (2013.01); *G09G 3/3688* (2013.01); *G11C 19/28* (2013.01); *G09G 2230/00* (2013.01); *G09G 2300/0408* (2013.01); *G09G 2300/0871* (2013.01); *G09G 2310/0286* (2013.01); *G09G 2310/0289* (2013.01); *G09G 2310/08* (2013.01); *G09G 2320/0219* (2013.01)

(58) Field of Classification Search
None
See application file for complete search history.

(56) References Cited

U.S. PATENT DOCUMENTS

| | | | | |
|---|---|---|---|---|
| 6,556,646 | B1 * | 4/2003 | Yeo ....................... | G09G 3/3677 377/54 |
| 2007/0195920 | A1 * | 8/2007 | Tobita .................. | G11C 19/184 377/64 |
| 2008/0101529 | A1 * | 5/2008 | Tobita .................. | G09G 3/3677 377/64 |

(Continued)

OTHER PUBLICATIONS

Extended European Search Report for European Patent Application No. EP 17187836.6, dated Mar. 12, 2018, 11 Pages.

*Primary Examiner* — Tuan T Lam
(74) *Attorney, Agent, or Firm* — Fenwick & West LLP (57) ABSTRACT

Provided are a gate driving circuit and a display device using the same. The gate driving circuit includes a shift register including a plurality of stages. A stage of the stages includes a first transistor configured to charge a first node with a first voltage level of a high voltage terminal of the stage. The first voltage level is higher than a second voltage level of a low voltage terminal of the stage. The stage further includes a control circuit connected to the first transistor. The control circuit is connected to the high voltage terminal and to an output terminal of a previous stage of the shift register. The control circuit is configured to control the first transistor to increase a voltage of the first node to be higher than a third voltage level, which is less than the first voltage level by a threshold voltage of the first transistor.

20 Claims, 7 Drawing Sheets

(56) References Cited

U.S. PATENT DOCUMENTS

| | | | |
|---|---|---|---|
| 2008/0187089 A1* | 8/2008 | Miyayama | G11C 19/28 377/79 |
| 2008/0224985 A1* | 9/2008 | Jang | G11C 19/28 345/100 |
| 2010/0111245 A1* | 5/2010 | Tobita | G11C 19/184 377/64 |
| 2010/0201666 A1* | 8/2010 | Tobita | G09G 3/3677 345/208 |
| 2011/0142191 A1* | 6/2011 | Tobita | G11C 19/184 377/64 |
| 2011/0291712 A1* | 12/2011 | Tobita | G09G 3/3677 327/144 |
| 2016/0240158 A1 | 8/2016 | Xu | |

* cited by examiner

GATE DRIVING CIRCUIT AND DISPLAY DEVICE USING THE SAME

CROSS-REFERENCE TO RELATED APPLICATIONS

This application claims the priority of Korean Patent Application No. 10-2016-0162184 filed on Nov. 30, 2016 and Korean Patent Application No. 10-2016-0182533 filed on Dec. 29, 2016, in the Korean Intellectual Property Office, all of which are incorporated herein by reference.

BACKGROUND

Technical Field

The present disclosure relates to a shift register and a display device using the same, with an improved response speed and an improved stability of an output signal.

Description of the Related Art

As information technology has developed, the commercial market of display devices has increased. Various electronic devices such as a mobile phone, a tablet computer, a navigation (GPS) device, a notebook computer, a television, a monitor, and a public display are widely used and the demand for display devices has increased. Examples of the display device include a liquid crystal display device and an organic light emitting diode display.

A typical display device includes a plurality of pixels that are used in displaying an image and a driving circuit which controls the plurality of pixels to transmit and/or emit light. At least a part of the driving circuit can be configured as a shift register.

The driving circuit of the display device includes a data driving circuit which supplies a data signal to data lines of a pixel array, a gate driving circuit (or a scan driving circuit) which sequentially supplies a gate signal (or a scan signal) synchronized with the data signal to gate lines (or scan lines) of the pixel array, and a timing controller which controls the data driving circuit and the gate driving circuit.

Consumers and various media applications require the screen resolution of the display device to be increased. For example, a virtual reality (VR) device or an augmented reality (AR) device is required to have a resolution of several thousand pixels per inch (PPI) and thus the time required for driving the pixels needs to be shortened in order to meet such higher resolution applications. Therefore, the display device needs to be faster and scan signals used in outputting images need to be more stably provided.

Each of the plurality of pixels may include a thin film transistor which supplies a voltage of a data line to a pixel electrode in response to a gate signal supplied through the gate line. The gate signal swings between a gate high voltage (VGH) and a gate low voltage (VGL). That is, the gate signal appears as a pulse.

The gate high voltage (VGH) is set to be higher than a threshold voltage of the thin film transistor formed on the display panel and the gate low voltage (VGL) is set to be lower than the threshold voltage of the thin film transistor. The thin film transistors of the pixels are turned on in response to the gate high voltage.

Recently, as the display device is manufactured to be thinner, technology which embeds the gate driving circuit in the display panel together with the pixel array is being developed. The gate driving circuit embedded in the display panel as described above is known as a gate in panel (GIP) driving circuit. Here, the gate driving circuit includes a shift register for generating a gate signal. The shift register includes a plurality of stages which are connected to each other in a dependent manner. The plurality of stages generate an output in response to a start signal and propagate the output to a next stage according to a shift clock. Therefore, the gate driving circuit sequentially drives the plurality of stages of the shift register to generate a gate signal (or a stage output signal).

The above-described shift register includes a first transistor which charges a Q node and a pull-up transistor which charges the gate signal of each stage in accordance with a signal of the Q node. In order to stably output the gate signal, it is desirable to apply a higher potential to the gate electrode of the pull-up transistor. In the meantime, the first transistor charges the Q node with a potential reduced by the threshold voltage from the gate high voltage. However, this may interfere with the stable output of the gate signal.

Therefore, improved control is needed to stably output the gate signal at each stage.

SUMMARY

Disclosed embodiments relate to a gate driving circuit and a display device using the same.

In one or more embodiments, a gate driving circuit includes a shift register having a plurality of stages. A stage of the plurality of stages comprises a first transistor configured to charge a first node of the stage with a first voltage level of a high voltage terminal of the stage. The first voltage level is higher than a second voltage level of a low voltage terminal of the stage. The stage further includes a control circuit connected to the first transistor. The control circuit is further connected to the high voltage terminal and to an output terminal of a previous stage of the shift register. The control circuit is configured to control the first transistor to increase a voltage of the first node to be higher than a third voltage level during a first time period. The third voltage level is less than the first voltage level by a threshold voltage of the first transistor.

In one or more embodiments, the first node has a fourth voltage level and a fifth voltage level during the first time period and a second time period after the first time period, respectively. The fourth voltage level is higher than the third voltage level and the fifth voltage level is higher than the fourth voltage level.

In one or more embodiments, the fifth voltage level is a sum of (i) the fourth voltage level and (ii) a difference between the first voltage level and the second voltage level.

In one or more embodiments, the control circuit includes a first control transistor and a second control transistor. The first control transistor, the second control transistor, and the first transistor may be connected to each other by sharing a second node of the stage.

In one or more embodiments, the first control transistor charges the second node in response to an output signal at the output terminal of the previous stage, and the second control transistor discharges the second node in response to an output signal at an output terminal of a subsequent stage of the shift register during a third time period. A voltage of the second node may be higher than the third voltage level, during the first time period.

In one or more embodiments, the control circuit further includes a third control transistor coupled between the high voltage terminal and the second node. The third control transistor is configured to control the second node to turn off the first transistor during a portion of the second time period to reduce discharging of the first node during the portion of the second time period.

In one or more embodiments, the control circuit further includes a first capacitor, where one electrode of the first capacitor is connected to the second node and another electrode of the first capacitor is connected to the first node.

In one or more embodiments, a voltage of the second node during the second time period is equal to or lower than a sum of the first voltage level and a threshold voltage of the third control transistor.

In one or more embodiments, each of the first control transistor and the third control transistor has a diode connection structure.

In one or more embodiments, the stage further includes a pull-up transistor configured to charge an output terminal of the stage in response to the voltage of the first node being the fifth voltage level during the second time period. The stage may further include a second capacitor coupled between the output terminal of the stage and the first node.

One or more embodiments disclosed herein relate to a shift register having a plurality of stages. A stage of the plurality of stages includes a first transistor coupled to a gate line of a display panel. The first transistor includes a gate electrode coupled to a first node of the stage. The stage further includes a second transistor comprising a source electrode coupled to the first node and a gate electrode coupled to a second node of the stage. A first capacitor is coupled between the source electrode and the gate electrode of the second transistor. The second transistor is configured to control a voltage of the first node in response to a voltage of the second node. The control circuit includes a third transistor coupled between the second node and a previous stage of the shift register. The control circuit is configured to receive an output signal of the previous stage of the shift register. The output signal swings between a first voltage level and a second voltage level lower than the first voltage level. The control circuit and the first capacitor together are configured to set the voltage of the second node to be at a fourth voltage level higher than a third voltage level, responsive to receiving the output signal of the previous stage at the first voltage level. The third voltage level is less than the first voltage level by a threshold voltage of the third transistor.

In one or more embodiments, a gate electrode and a drain electrode of the third transistor are coupled to the previous stage to receive the output signal, and a source electrode of the third transistor is coupled to the second node.

In one or more embodiments, the voltage of the second node may be set to be at the fourth voltage level through a capacitive coupling of the first capacitor. The first capacitor may be a parasitic capacitor of the second transistor or a non-parasitic capacitor of the second transistor.

In one or more embodiments, a second capacitor is coupled between the gate electrode of the first transistor and a source electrode of the first transistor. The second transistor may charge the second capacitor to set the voltage of the first node at the fourth voltage level during a first time period. The first transistor and the second capacitor together may increase the voltage of the first node to a fifth voltage level higher than the fourth voltage level during a second time period after the first time period.

In one or more embodiments, the control circuit further includes a fourth transistor having a gate electrode and a drain electrode coupled to the second node and a source electrode coupled to a voltage supply terminal. The fourth transistor may be configured to maintain the voltage of the first node within a range during the second time period.

In one or more embodiments, the first transistor, the second transistor, the third transistor, and the fourth transistor are n-type transistors.

Embodiments disclosed herein relate to a display device including a shift register disclosed herein and a display panel. The display panel includes a plurality of pixels, where each row of the plurality of pixels is coupled to a corresponding gate line.

Various aspects to be achieved by the present disclosure, the means for achieving such, and effects of the present disclosure described above do not specify essential features of the claims, and, thus, the scope of the claims is not limited to the disclosure of the present disclosure.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Advantages and characteristics of the present disclosure and methods of achieving such will be clearly understood by referring to exemplary embodiments described below in detail together with the accompanying drawings. However, the present disclosure is not limited to exemplary embodiment disclosed herein but can be implemented in various forms. The exemplary embodiments are provided such that a person of ordinary skilled in the art can fully understand and practice the inventive concepts and features herein The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of certain technologies may have been omitted to avoid unnecessarily obscuring of the subject matter of the present disclosure. The terms such as "including," "having," and "consist of" used herein are generally intended to allow other components to be added unless the terms are used with the term "only". Any references to singular elements may include a plurality of such elements unless expressly stated otherwise. Components are interpreted to include an ordinary margin of error or error range even if not expressly stated.

When a positional relationship between two parts is described using the terms such as "on", "above", "below", and "next", one or more parts may be positioned between the two parts unless the terms are used with the term "immediately" or "directly" is not used. If it is described that a component is "connected" or "coupled" to another component, it is understood that the component is directly connected or coupled to the other component but another component may be "interposed" between the components, or the each component may be "connected" or "coupled" via another component.

Although the terms "first", "second", and the like are used for describing various components, these terms are merely used for distinguishing one component from other components.

A size and a thickness of each component illustrated in the drawings are depicted for convenience of description, and the present disclosure is not limited to the size and the thickness of the component illustrated.

Hereinafter, various exemplary embodiments of the present disclosure will be described in detail with reference to accompanying drawings.

Figure 1:
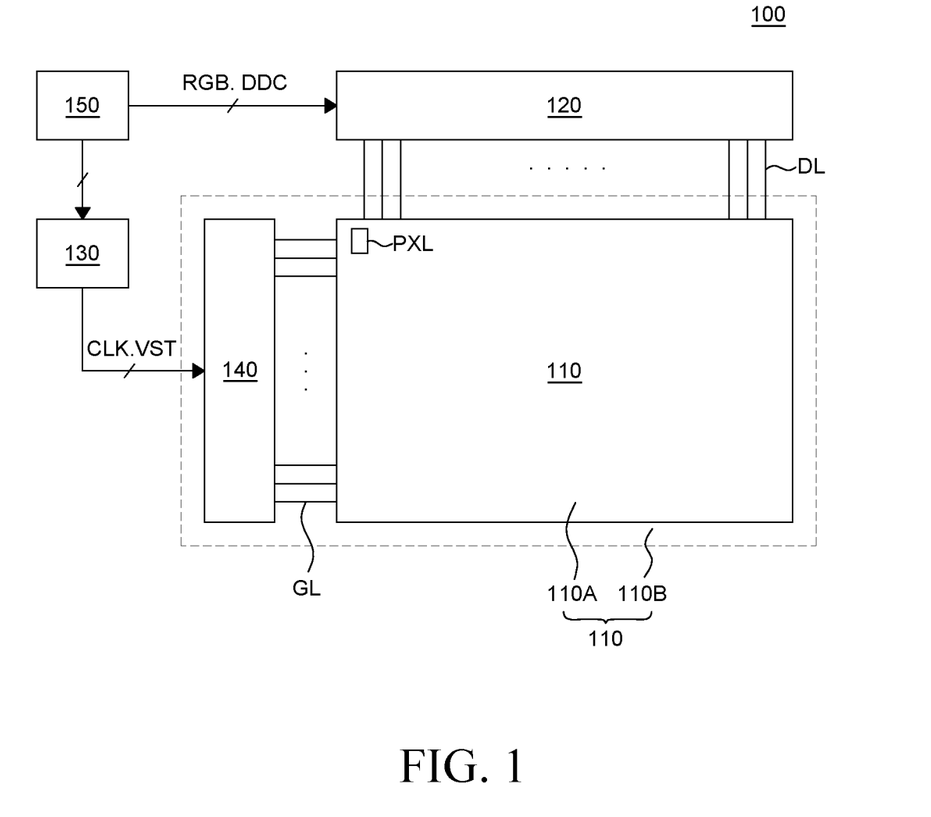
FIG. 1 is a schematic block diagram of a display device according to an exemplary embodiment of the present disclosure.

FIG. 1 is a schematic block diagram of a display device according to an exemplary embodiment of the present disclosure.

Referring to FIG. 1, a display device 100 includes a display panel 110, a timing controller 150, a data driver 120, and scan drivers 130 and 140.

The display panel 110 includes a plurality of pixels PXL which are operatively connected with a plurality of data lines DL and a plurality of scan lines GL. The display panel 110 includes a display area 110A having the plurality of pixels PXL and a non-display area 110B in which various signal lines or pads are formed at the outside of the display area 110A. The display panel 110 may be implemented as a liquid crystal display (LCD), an organic light emitting diode display (OLED), an electrophoretic display (EPD), and the like.

One pixel PXL includes at least one transistor connected to the scan line GL or the data line DL and a pixel circuit which operates in response to a scan signal and a data signal supplied via the transistor. The pixels PXL can be implemented for liquid display panels, for an organic light emitting display panels, or the like depending on the configuration of the pixel circuit.

The timing controller 150 receives timing signals such as a vertical synchronization signal, a horizontal synchronization signal, a data enable signal, or a dot clock through a receiving circuit such as an LVDS or TMDS interface connected to other circuitry. The timing controller 150 generates timing control signals to control an operation timing of the data driver 120 and the scan drivers 130 and 140 on the basis of the input timing signal.

The data driver 120 may include a plurality of source drive integrated circuits (ICs). The source drive ICs are supplied with digital video data RGB and a source timing control signal DDC from the timing controller 150. The source drive IC converts the digital video data RGB into a gamma voltage in response to the source timing control signal DDC to generate a data voltage and supplies the data voltage through the data line DL of the display panel 110. Each source driver IC may be connected to the data line DL of the display panel 110 through a chip on glass (COG) process or a tape automated bonding (TAB) process. The source drive IC may be formed on the display panel 110, or formed on a separate PCB (or other type of substrate) to be connected to the display panel 110.

The scan drivers 130 and 140 may include a level shifter 130 and a shift register 140. The level shifter 130 enhances at least one of the voltage levels of clock signals CLK which are input at a level of transistor-transistor-logic (TTL) e.g., between 0 V and 3.3 V from the timing controller 150 and then supplies the enhanced clock signals to the shift register 140. The shift register 140 may be formed in the non-display area 110B of the display panel 110 in a gate-in-panel (GIP) manner as a thin film transistor. The shift register 140 is configured by stages which operate to shift the scan signal in accordance with the clock signals CLK and the start signal Vst to output the shifted scan signal. The stages included in the shift register 140 sequentially output the scan signals.

The voltage of the scan signals swing between the gate high voltage VGH and the gate low voltage VGL. The pixels of the display panel 110 pass or emit light in accordance with the corresponding data signal while the scan signals are output as a gate high voltage VGH through a stage output terminal. Thereafter, an output terminal of the stage corresponding to the pixel which emitted light outputs the gate low voltage VGL so as to suppress inflow of the data signal corresponding to a scan line GL into the pixel which emitted light.

As described above, the scan signal of the stage output terminal repeatedly rises to a gate high voltage VGH at a particular timing and drops to a gate low voltage VGL at a particular timing. Further, as the time required to rise from the gate low voltage VGL to the gate high voltage VGH or drop from the gate high voltage VGH to the gate low voltage VGL is reduced, the scan signal having a stable output characteristic that is appropriate for a display device implemented with a high resolution can be obtained. A shift register having the characteristics as described above will be described with reference to the drawings.

The shift register 140 includes a plurality of stages. The shift register 140 may include N (N is a positive integer) stages which are connected to each other. Each of the plurality of stages generates an output signal in response to a start signal terminal VST and transmits the output signal to the next stage in accordance with a signal of the clock signal terminal CLK. Therefore, the gate driving circuit sequentially drives the plurality of stages of the shift register 140 to generate a gate signal.

Figure 2:
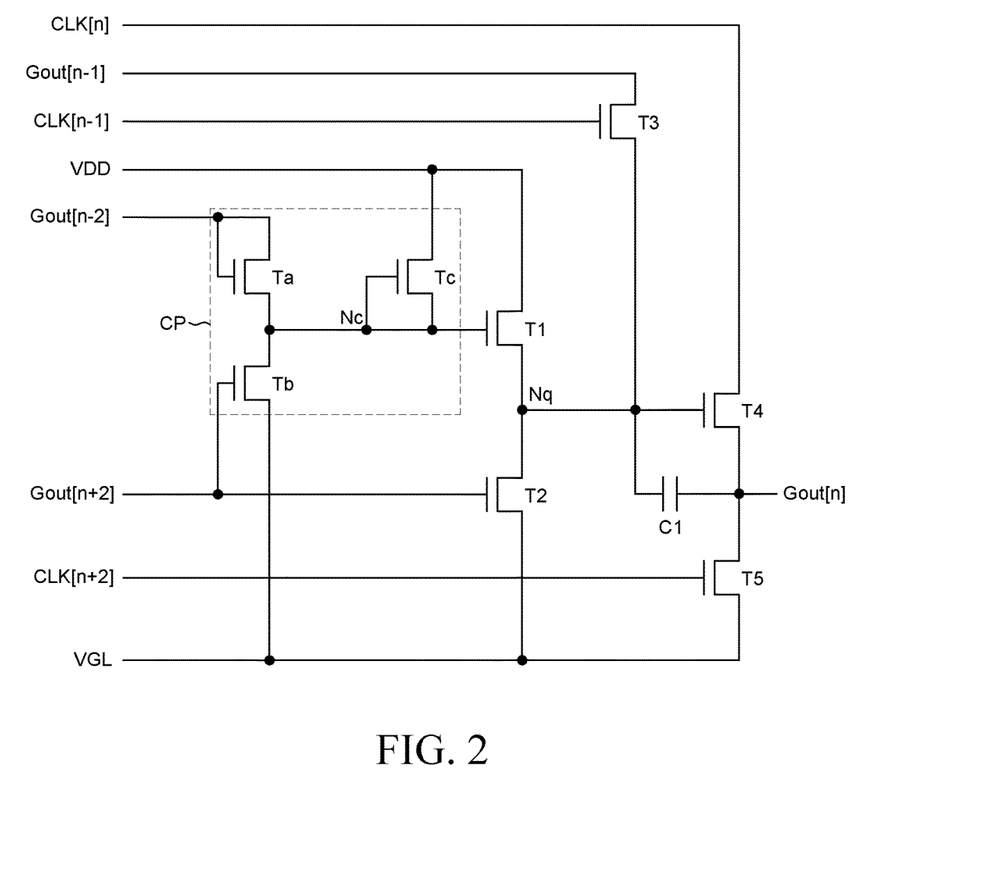
FIG. 2 is a circuit diagram of an N-th stage according to an exemplary embodiment of the present disclosure.

FIG. 2 is a circuit diagram of an N-th stage according to an exemplary embodiment of the present disclosure.

As illustrated in FIG. 2, the N-th stage of the shift register includes a control part CP (also referred to as a "control circuit"), a first to a fifth transistors T1 to T5, and a first capacitor C1.

The first transistor T1 is switched (turned on or turned off) in accordance with a control signal of the control part CP and charges the Q node Nq with a potential of the high potential voltage terminal VDD. A gate, a source, and a drain of the first transistor T1 are connected to a common node Nc, the Q node Nq, and the high potential voltage terminal VDD, respectively. The potential of the high potential voltage terminal VDD may be equal to a high voltage of the clock signal or the gate high voltage VGH of the stage output signal.

A second transistor T2 is switched in accordance with a signal of an output terminal of a subsequent stage, for example, an N+2-th stage output terminal Gout[n+2] and discharges the potential of the Q node Nq to the low potential voltage terminal VGL. A gate, a source, and a drain of the second transistor T2 are connected to an N+2-th stage output terminal Gout[n+2], the low potential voltage terminal VGL, and the Q node Nq, respectively. In this case, the potential of the low potential voltage terminal VGL may be equal to a low voltage of the clock signal or a gate low voltage of the stage output signal.

A third transistor T3 is switched in accordance with a signal of the N−1-th clock signal terminal CLK[n−1]. The third transistor T3 discharges a potential of the Q node Nq to the N−1-th stage output terminal Gout[n−1] or charges the Q node Nq with the potential of the N−1-th stage output terminal Gout[n−1]. A gate, a source, and a drain of the third transistor T3 are connected to an N−1-th clock signal terminal CLK[n−1], an N−1-th stage output terminal Gout [n−1], and the Q node Nq, respectively.

A fourth transistor T4 is switched in accordance with a signal of the Q node Nq and charges the N-th stage output terminal Gout[n] with the potential of the N-th clock signal terminal CLK[n]. A gate, a source, and a drain of the fourth transistor T4 are connected to the Q node Nq, an N-th stage output terminal Gout[n], and an N-th clock signal terminal CLK[n], respectively.

A fifth transistor T5 is switched in accordance with a signal of an N+2-th clock signal terminal CLK[n+2] and discharges the N-th stage output terminal Gout[n] to the low potential voltage terminal VGL. A gate, a source, and a drain of the fifth transistor T5 are connected to an N+2-th clock signal terminal CLK[n+2], the low potential voltage terminal VGL, and the N-th stage output terminal Gout[n], respectively.

The control part CP includes a first control transistor Ta and a second control transistor Tb as shown in FIG. 2.

The first control transistor Ta is switched in accordance with the signal of the N−2-th stage output terminal Gout[n−2] and charges the common node Nc with a potential of the N−2-th stage output terminal Gout[n−2]. Referring to FIG. 2, the first control transistor Ta may have a diode connection structure in which a gate and a drain are connected to each other. The gate and the drain of the first control transistor Ta are connected to the N−2-th stage output terminal Gout[n−2], and a source of the first control transistor Ta is connected to the common node Nc.

The second control transistor Tb is switched in accordance with the signal of the N+2-th stage output terminal Gout[n+2] and discharges the common node Nc. A gate, a source, and a drain of the second control transistor Tb are connected to an N+2-th stage output terminal Gout[n+2], the low potential voltage terminal VGL, and the common node Nc, respectively.

The control part CP may further include a third control transistor Tc as shown in FIG. 2.

The third control transistor Tc is switched in accordance with the signal (or a voltage) of the common node Nc and discharges the common node Nc according to the signal of the common node Nc. Referring to FIG. 2, the third control transistor Tc may have a diode connection structure in which a gate and a drain are connected to each other. In this case, the gate and the drain of the third control transistor Tc are connected to the common node Nc. A source of the third control transistor Tc is connected to the high potential voltage terminal VDD.

One electrode of a first capacitor C1 is connected to the Q node Nq and the other electrode of the first capacitor C1 is connected to an N-th stage output terminal Gout[n]. As such, the first capacitor C1 bootstraps the Q node Nq.

In one or more embodiments, the N-th stage includes n-type transistors without any p-type transistors. That is, the first through fifth transistors T1 to T5 and transistors Ta, Tb, Tc may be implemented as n-type transistors. An n-type transistor has higher a mobility than a p-type transistor, thereby allowing each stage of the shift register to operate faster than a stage implementing the p-type transistor.

Figure 3:
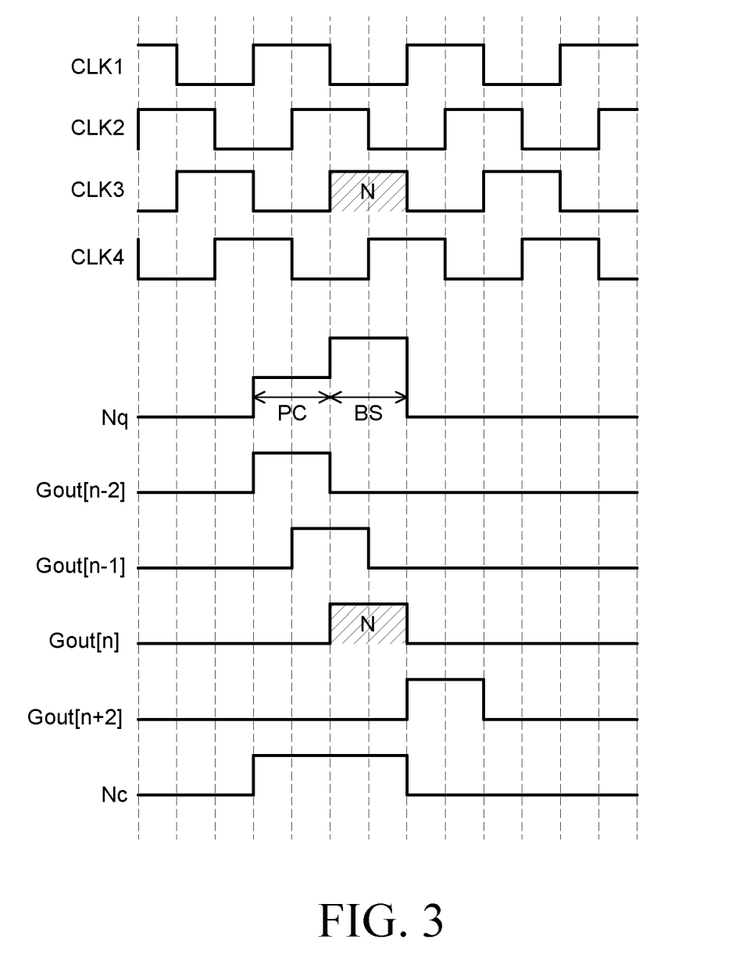
FIG. 3 is a schematic timing chart of the N-th stage illustrated in FIG. 2.

FIG. 3 is a schematic timing chart of the N-th stage illustrated in FIG. 2.

An operation of a circuit corresponding to the N-th stage illustrated in FIG. 2 will be described in detail with reference to FIG. 3. The timing chart illustrated in FIG. 3 is a simple image showing a particular position and width of the waveform which are merely an example, but the present disclosure is not limited thereto.

The clock signals illustrated in FIG. 3 are four phase signals and first to fourth clock signals CLK1 to CLK4 are formed to be sequentially converted from a high voltage to a low voltage. Potentials of the high voltage and the low voltage of the clock signal may be equal to the gate high voltage VGH and the gate low voltage VGL of the stage output signal, respectively. A first clock signal CLK1 has an overlapping period with a second clock signal CLK2, the second clock signal CLK2 has an overlapping period with a third clock signal CLK3, and the third clock signal CLK3 has an overlapping period with a fourth clock signal CLK4. Four phase clock signals CLK1 to CLK4 may overlap with each other by halves of the high voltage period, but the present disclosure is not limited thereto. Further, in the exemplary embodiment, the four phase clock signals are applied, but the present disclosure is not limited thereto. A clock signal CLK3 may be applied to the N-th clock signal terminal CLK[n] of FIG. 2; a clock signal CLK2 may be applied to the N−1-th clock signal terminal CLK[n−1] of FIG. 2; and a clock signal CLK1 may be applied to the N+2-th clock signal terminal CLK[n+2] of FIG. 2.

When the potential of the N−2-th stage output terminal Gout[n−2] is changed to the gate high voltage VGH during a precharging PC period, the first control transistor Ta charges the common node Nc with the gate high voltage VGH. In this case, the first transistor T1 whose gate is connected to the common node Nc is turned on and thus the potential of the high potential voltage terminal VDD is supplied to the Q node Nq. A period, when the Q node Nq is maintained at a gate high voltage VGH by the first transistor T1, is the precharging PC period of the Q node Nq.

In the meantime, the fourth transistor T4, which operates in accordance with a signal of the Q node Nq, is turned on during the precharging PC period of the Q node Nq. However, since the N-th clock signal CLK[n] (e.g., CLK3) is a gate low voltage VGL during the precharging PC period, the N-th stage output signal is also maintained at the gate low voltage VGL.

When the signal of the N−2-th stage output terminal Gout[n−2] is changed from the gate high voltage VGH to the gate low voltage VGL, the first control transistor Ta is turned off and the charging to the common node Nc stops. Specifically, when the signal of the N−2-th stage output terminal Gout[n−2] is dropped below a threshold voltage of the first control transistor Ta, the charging to the common node Nc stops. This is because the first control transistor Ta is turned off since the gate-source voltage Vgs of the first control transistor Ta becomes equal to a threshold voltage of the first control transistor Ta.

In the meantime, the third transistor T3, whose gate is connected to the N−1-th clock signal terminal CLK[n−1], is turned on while the potential of the N−1-th clock signal terminal CLK[n−1] (e.g., CLK2) is changed to the gate high voltage VGH. Therefore, the signal of the N−1-th stage output terminal Gout[n−1] which is output to the gate high voltage VGH is supplied to the Q node Nq. A first half period when the signal of the N−1-th clock signal terminal CLK [n−1] is maintained at a gate high voltage VGH overlaps with the precharging PC period of the Q node Nq. Therefore, during a short period when the first transistor T1 is turned off, the Q node Nq may be stably maintained at the gate high voltage VGH by the third transistor T3.

Next, during a first half of the bootstrap BS period when the signal of the N−2-th stage output terminal Gout[n−2] drops from the gate high voltage VGH to be maintained at the gate low voltage VGL, the fourth transistor T4 is maintained to be turned on in accordance with the Q node Nq which is maintained at the gate high voltage VGH. In this case, since the signal of the N-th clock signal terminal CLK[n] is the gate high voltage VGH, the N-th stage output terminal Gout[n] outputs the gate high voltage VGH.

In the meantime, the potential of the Q node Nq rises by the first capacitor C1. A period when the potential of the Q node Nq becomes higher than the gate high voltage VGH is referred to as the bootstrap BS period.

A potential change during the bootstrap BS period of the Q node Nq may be described in relation to the electrical charge conservation law. During the bootstrap BS period, the following Equation is established.

$$C(\Delta Va - \Delta Vb) = C_{TFT}(\Delta Vb - \Delta Vc)$$ [Equation]

In this Equation, C is an electrostatic capacitance of the first capacitor C1, $\Delta Va$ is a potential change amount of the Q node Nq, $\Delta Vb$ is a potential change amount of the N-th stage output terminal Gout[n], $C_{TFT}$ is a parasitic capacitance of the fourth transistor T4, and $\Delta Vc$ is a potential change amount of the N-th clock signal. Since a difference between $\Delta Vb$ and $\Delta Vc$ is about zero during the bootstrap BS period of the Q node Nq, as a result, it can be said that $\Delta Va$ is equal to $\Delta Vb$. Therefore, the potential of the Q node Nq may rise to be higher than the gate high voltage VGH during the bootstrap BS period, as illustrated in FIG. 3. Since the value of $\Delta Va$ is equal to the value of $\Delta Vb$, a changed amount of the potential of the Q node Nq is equal to a changed amount of the potential of the N-th stage output terminal Gout[n]. Therefore, during the bootstrap BS period, the potential of the Q node Nq rises as much as the difference between the gate high voltage VGH and the gate low voltage VGL.

A role of the transistor is to transfer a signal of the drain to the source. Without bootstrapping of the Q node Nq, the gate-source voltage Vgs of the fourth transistor T4 may be equal to or lower than the threshold voltage Vth. Accordingly, the fourth transistor T4 may be turned off. However, as illustrated in FIG. 3, when the Q node Nq bootstraps BS to be maintained at a potential which is higher than the gate high voltage VGH, the fourth transistor T4 can be turned on for a longer time. Therefore, charging efficiency of the fourth transistor T4 may be further improved. Further, even though the fourth transistor T4 deteriorates after a particular time (e.g., after prolonged use), since a voltage higher than the gate high voltage VGH is applied to the gate of the fourth transistor T4, the turned-on period may be maintained longer. Therefore, the deterioration of the fourth transistor T4 may be compensated by bootstrapping the Q node Nq.

Next, as the fifth transistor T5 is turned on in accordance with the signal of an N+2-th clock signal terminal CLK[n+2] (e.g., CLK1), the potential of the N-th stage output terminal Gout[n] is discharged. Therefore, the N-th stage output signal is output as the gate low voltage VGL. By doing this, the bootstrap BS period ends and the N-th stage output signal is maintained at the gate low voltage VGL.

After the bootstrap BS period of the Q node Nq of the N stage ends, the N-th stage output signal needs to be maintained at the gate low voltage VGL until the next frame. In the meantime, some external noise signal components may be mixed into the common node Nc or the Q node Nq. Accordingly, a ripple signal may appear at the common node Nc or the Q node Nq so that the fourth transistor T4 may undesirably be turned on. As a result, the gate high voltage VGH of the clock signal may transfer to the N-th stage output terminal Gout[n] so that a multi output may be generated to turn on two or more rows of pixels. The multi output refers to a phenomenon in which a voltage of a potential other than the gate low voltage VGL is output during a period where the stage output signal needs to be maintained at the gate low voltage VGL.

In order to suppress the above-described multi output, a new circuit design may be adopted as follows.

For example, the second control transistor Tb of the control part CP is synchronized with an end time of the bootstrap BS period to discharge the common node Nq. When the signal of the N+2-th stage output terminal Gout [n+2] is changed from the gate low voltage VGL to the gate high voltage VGH after the bootstrap BS period, the second control transistor Tb discharges the potential of the common node Nq to the low potential voltage terminal VGL. By doing this, the second control transistor Tb may control the first transistor T1 so as not to be turned on after the bootstrap BS period.

The second transistor T2 is synchronized with the signal of the N+2-th stage output terminal Gout[n+2] to discharge the Q node Nq. By doing this, the operation of the fourth transistor T4 may be turned off and the multi output may be suppressed in advance.

In the meantime, a ripple signal may be generated in the Q node Nq in accordance with rising edges of the clock signal. In order to suppress such ripple signals, the third transistor T3 periodically discharges the Q node Nq in synchronization with the N−1-th clock signal. Therefore, occurrence of the ripple signal of the Q node Nq may be reduced and the multi output of the stage may be reduced.

Referring to FIG. 2, the first control transistor Ta may have a diode connection structure, in which a gate and a drain are connected to each other, to reduce occurrence of the ripple signal. If the ripple signal flows into the gate of the transistor having the diode connection structure, the drain-source voltage Vds may be lower than that of the transistor which is not configured with the diode connection structure. Accordingly, the probability of occurrence of the ripple signal in the common node Nc may be reduced.

In the meantime, when the transistor is turned on, as the potential difference between the gate and the source is larger, the current flowing through the transistor becomes also larger. That is, as the higher voltage is applied to the gate, the efficiency of the transistor may be improved. In other words, as the gate-source voltage Vgs of the fourth transistor T4 illustrated in FIG. 2 becomes higher, a speed, at which the gate high voltage VGH is charged to the N-th stage output terminal Gout[n], may be faster.

Referring to the above Equation again, it has been described that $\Delta Va$ represents a potential change amount of the Q node Nq, $\Delta Vb$ represents the potential change amount of the N-th stage output terminal Gout[n], and the value of $\Delta Va$ is equal to the value of $\Delta Vb$. If the rising range is fixed, a maximum potential value after rising is determined by a maximum potential value before rising. Here, a maximum potential value of the Q node Nq before rising is a maximum potential value of the Q node Nq during the precharging PC period. Therefore the rising range of a voltage of the Q node Nq is a difference value between the gate high voltage VGH and the gate low voltage VGL. That is, during the bootstrap BS period, the potential of the Q node Nq further rises as much as the difference value between the gate high voltage VGH and the gate low voltage VGL from the maximum potential during the precharging PC period. That is, the maximum potential value during the bootstrap BS period may be determined depending on the maximum potential value during the precharging PC period.

An improved shift register will be described in detail with reference to FIGS. 4A to 5B.

Figure 4A:
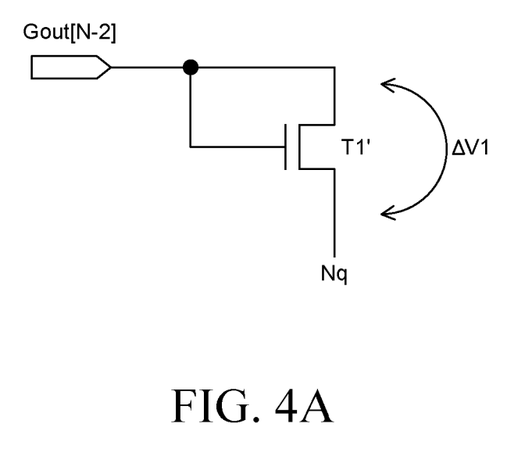
FIG. 4A is a first transistor according to a comparative embodiment.
Figure 4B:
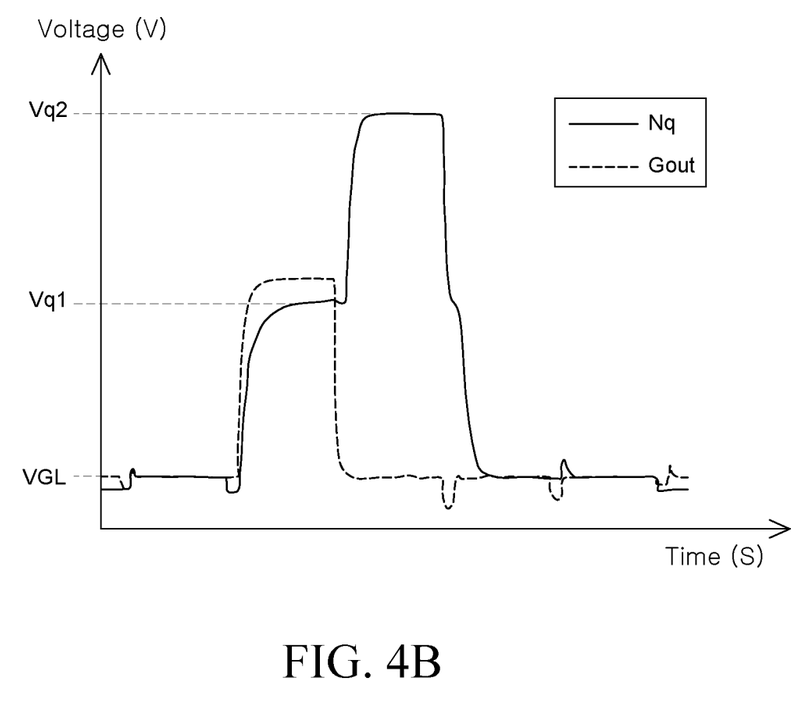
FIG. 4B is a diagram of a driving waveform of the circuit illustrated in FIG. 4A.
Figure 5A:
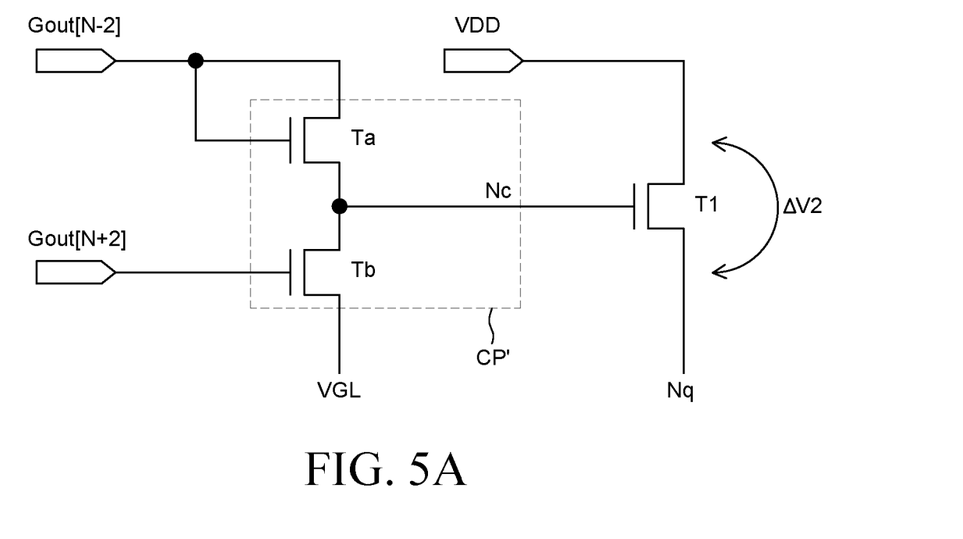
FIG. 5A is a diagram of a circuit according to an exemplary embodiment of the present invention.
Figure 5B:
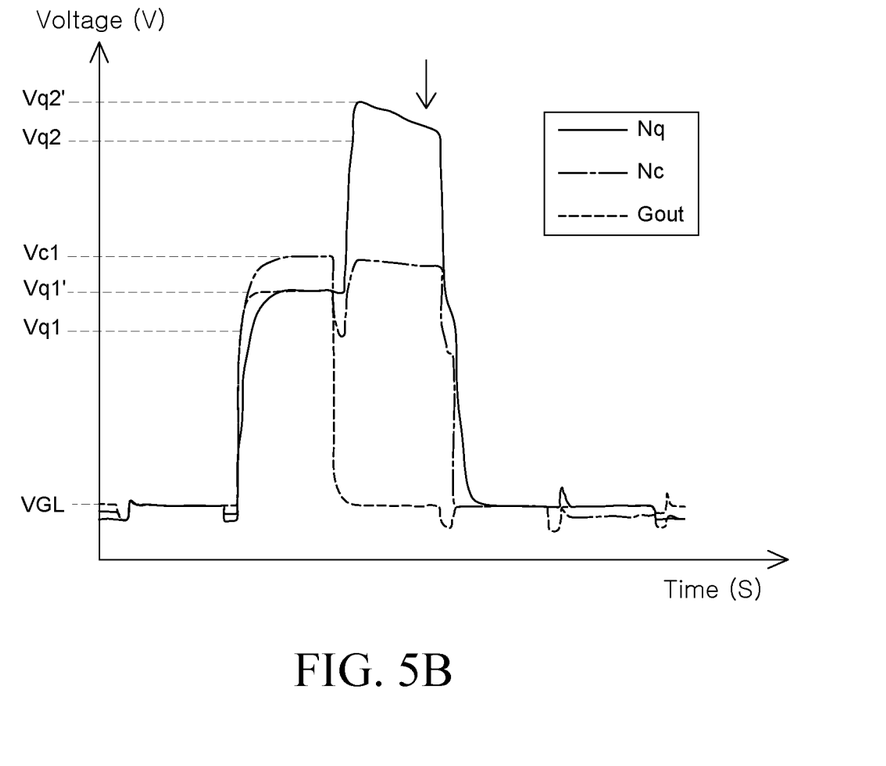
FIG. 5B is a diagram of a driving waveform of the circuit illustrated in FIG. 5A.

FIG. 4A is a circuit diagram according to a comparative embodiment and FIG. 4B is a diagram of a driving waveform of the circuit illustrated in FIG. 4A. FIG. 5A is a circuit diagram according to an exemplary embodiment of the present disclosure and FIG. 5B is a diagram of a driving waveform of the circuit illustrated in FIG. 5A.

FIG. 4A illustrates a part of a shift register which does not include a control part CP in the circuit diagram illustrated in FIG. 2. FIG. 5A illustrates a part of the shift register which includes a control part CP'.

In a first transistor T1' of FIG. 4A, a gate and a drain are connected to the N−2-th stage output terminal Gout[n−2] and a source of the first transistor T1' is connected to the Q node Nq. Further, in a first transistor T1 of FIG. 5A, a gate is connected to the common node Nc, a source is connected to the Q node Nq, and a drain is connected to the high potential voltage terminal VDD.

Referring to FIGS. 4A and 4B, a potential of the Q node Nq rises up to Vq1 during the precharging PC period and rises up to Vq2 during the bootstrap BS period. That is, the potential of the Q node Nq during the bootstrap BS period may jump from Vq1, which is the maximum potential value of the Q node Nq during the precharging PC period. In this case, Vq1 is a potential value reduced by the threshold voltage Vth of the first transistor T1' from the gate high voltage VGH.

In contrast, referring to FIGS. 5A and 5B, a potential of the Q node Nq rises up to Vq1' during the precharging PC period and rises up to Vq2' during the bootstrap BS period. That is, the potential of the Q node Nq during the bootstrap BS period may jump from Vq1' which is the maximum potential of the Q node Nq during the precharging PC period.

The shift register according to the exemplary embodiment of the present disclosure includes a control part. The circuit illustrated in FIG. 5A represents a part of the shift register which includes the control part CP' and the first transistor T1. Referring to FIG. 5A, the control part CP' has a common node Nc connected to the gate of the first transistor T1. A potential of the common node Nc rises to the gate high voltage VGH by a first control transistor Ta during the precharging PC period, and a potential of the Q node Nq also rises to the gate high voltage VGH by the first transistor T1.

In one aspect, a voltage of the common node Nc may be lower than the gate high voltage VGH by a threshold voltage Vth of the first control transistor Ta. The threshold voltage Vth of transistors included in the shift register may be similar to each other. However, a coupling effect by a parasitic capacitance Cgs of the first transistor T1 may affect the common node Nc. The parasitic capacitance Cgs may be formed between the gate and the source of the first transistor T1. The parasitic capacitance Cgs may enhance the potential of the common node Nc to a Vc1 potential. The common node Nc is charged by the first control transistor Ta, and a drain of the first control transistor Ta is connected to the N-th stage output terminal Gout[n]. The Q node Nq is charged by the first transistor T1, and a drain of the first transistor T1 is connected to the high potential voltage terminal VDD. Therefore a time during which the Q node Nq is charged may be shorter than a time during which the common node Nc is charged. As a result a voltage of the Q node Nq may surpass a voltage of the common node Nc. In the meantime, a capacitor has a property that a voltage difference of both distal electrodes is maintained constant. Therefore a rising voltage at the Q node Nq may affect the common node Nc by the coupling effect. In this case, Vc1 may be higher than a difference between the gate high voltage VGH and the threshold voltage of the first control transistor Ta or higher than the gate high voltage VGH. Accordingly, the potential of the common node Nc may be compensated.

As the common node Nc is compensated, the gate-source voltage Vgs of the first transistor T1 can rise and a precharging PC voltage of the Q node Nq can rise more relative to the circuit which does not include the control part CP'. As a result, at a point where the bootstrap BS starts, the rising edge of the signal of the Q node Nq may be more sharply formed. The faster the signal of the Q node Nq rises to the gate high voltage VGH, the faster a fourth transistor T4 of FIG. 2 can turn on such that the output characteristic of the shift register may be further improved.

Referring to FIGS. 4B and 5B, during the precharging PC period, the potential of the Q node Nq of the shift register which includes the control part CP' is Vq1' and is higher than the potential Vq1 of the Q node Nq of the shift register without the control part CP'.

Figure 6A:
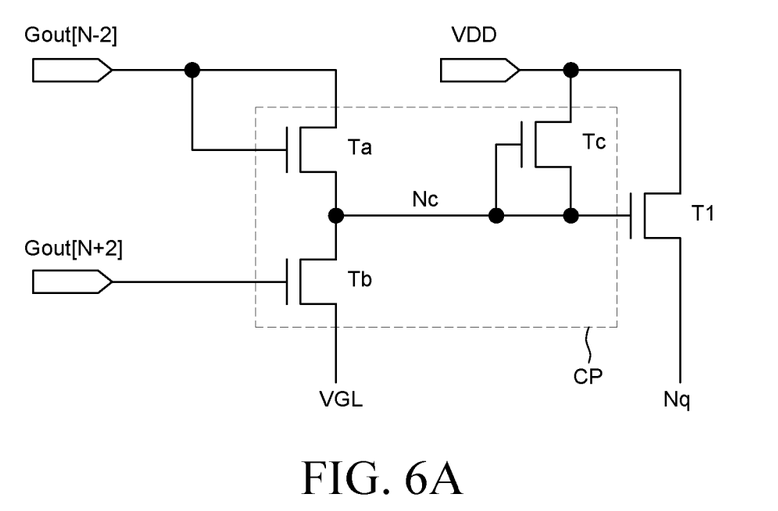
FIG. 6A is a diagram of a circuit according to an exemplary embodiment of the present invention.

If a signal of the high potential voltage terminal VDD illustrated in FIGS. 2, 5A, and 6A is constant, the coupling effect may be more remarkable. For example, the signal of the high potential voltage terminal VDD may be a constant voltage which is equal to the gate high voltage VGH of the stage output signal. The shift register of FIG. 2 is an example where the drain electrode of the first transistor T1 is applied by the high potential voltage when the Q node Nq is started to charge shortly thereafter. In this case of FIG. 2, a drain-source voltage Vds of the first transistor T1 may be larger relative to the case in which a drain electrode of a first transistor T1 is connected to a previous stage output. Therefore, the Q node Nq may be charged faster and rise to a sufficient potential during a determined time. Further, the potential of the common node Nc may rise more quickly and stably rise by the coupling effect. Therefore, the time when the stage output signal reaches the gate high voltage VGH may be shortened and the output characteristic of the shift register may be improved.

The potential of the common node Nc may rise to Vc1 due to the parasitic capacitance Cgs of the first transistor T1. In this case, the magnitude of Vc1 may be higher than that of the gate high voltage VGH and may further rise in accordance with a magnitude of the parasitic capacitance of the first transistor T1. As the magnitude of the Vc1, which is the potential of the common node, becomes higher, the maximum precharging PC potential of the common node Nq or the maximum bootstrap BS potential may be further increased. In the meantime, if the potential of the common node Nc is higher than the sum of the gate high voltage VGH and the threshold voltage Vth, the gate-source voltage Vgs of the first transistor T1 may be higher than the threshold voltage Vth. Accordingly, during the bootstrap BS period, the first transistor T1 may be turned on so that the potential of the Q node Nq may be discharged to the high potential voltage terminal VDD. In this case, the potential of the Q node Nq during the bootstrap BS period may be gradually lowered from the maximum potential Vq2' as illustrated in FIG. 5A. If the potential of the Q node Nq is lowered during the bootstrap BS period, the gate-source voltage Vgs of the fourth transistor T4 is also lowered. As a result, the output characteristic of the shift register may deteriorate.

Figure 6B:
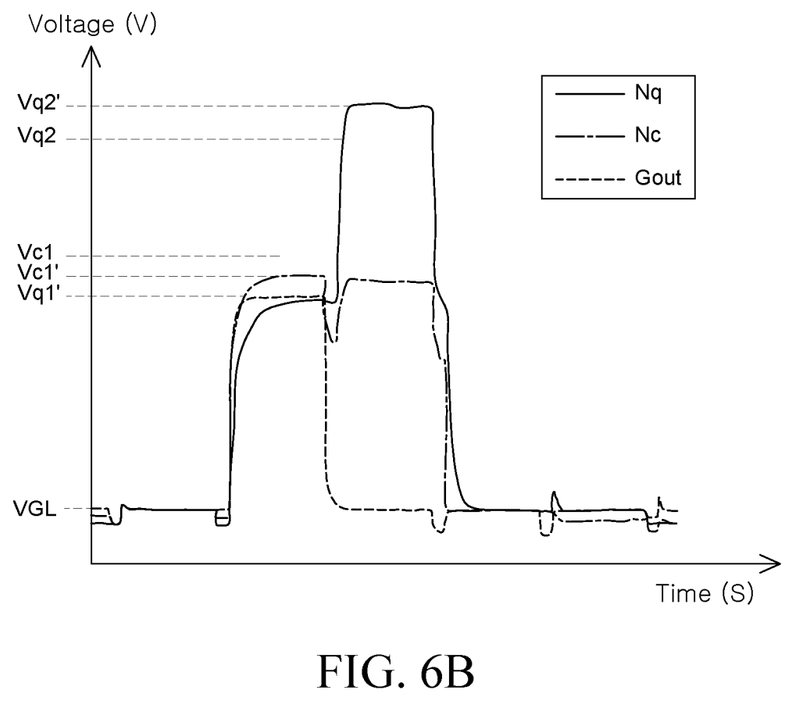
FIG. 6B is a diagram of a driving waveform of the circuit illustrated in FIG. 6A.

FIG. 6A is a circuit diagram according to an exemplary embodiment of the present disclosure and FIG. 6B is a diagram of a driving waveform of the circuit illustrated in FIG. 6A.

A control part CP illustrated in FIG. 6A is the same as the control part CP illustrated in FIG. 2.

The third control transistor Tc controls the potential of the common node Nc so as not to exceed a specific potential. Specifically, when the potential of the common node Nc exceeds the sum of the gate high voltage VGH and the threshold voltage Vth, the third control transistor Tc is turned on to discharge the common node Nc. Therefore, the third control transistor Tc controls the maximum potential of the common node Nc so as not to exceed the sum of the gate high voltage VGH and the threshold voltage Vth.

The third control transistor Tc controls the potential of the common node Nc. Further, the third control transistor Tc controls the first transistor T1 to be turned off during the bootstrap BS period. As a result, the third control transistor Tc prevents Q node Nq from being discharged. Referring to FIG. 6B, the maximum potential of the common node Nc is maintained at Vc1' during the precharging PC period. Further, the maximum potential of the Q node Nq is maintained at Vq2' during the bootstrap BS period and substantially maintained to be a flat potential. Accordingly, the potential of the Q node Nq is stably output, so that the output characteristic of the shift register may also be stable.

Figure 7:
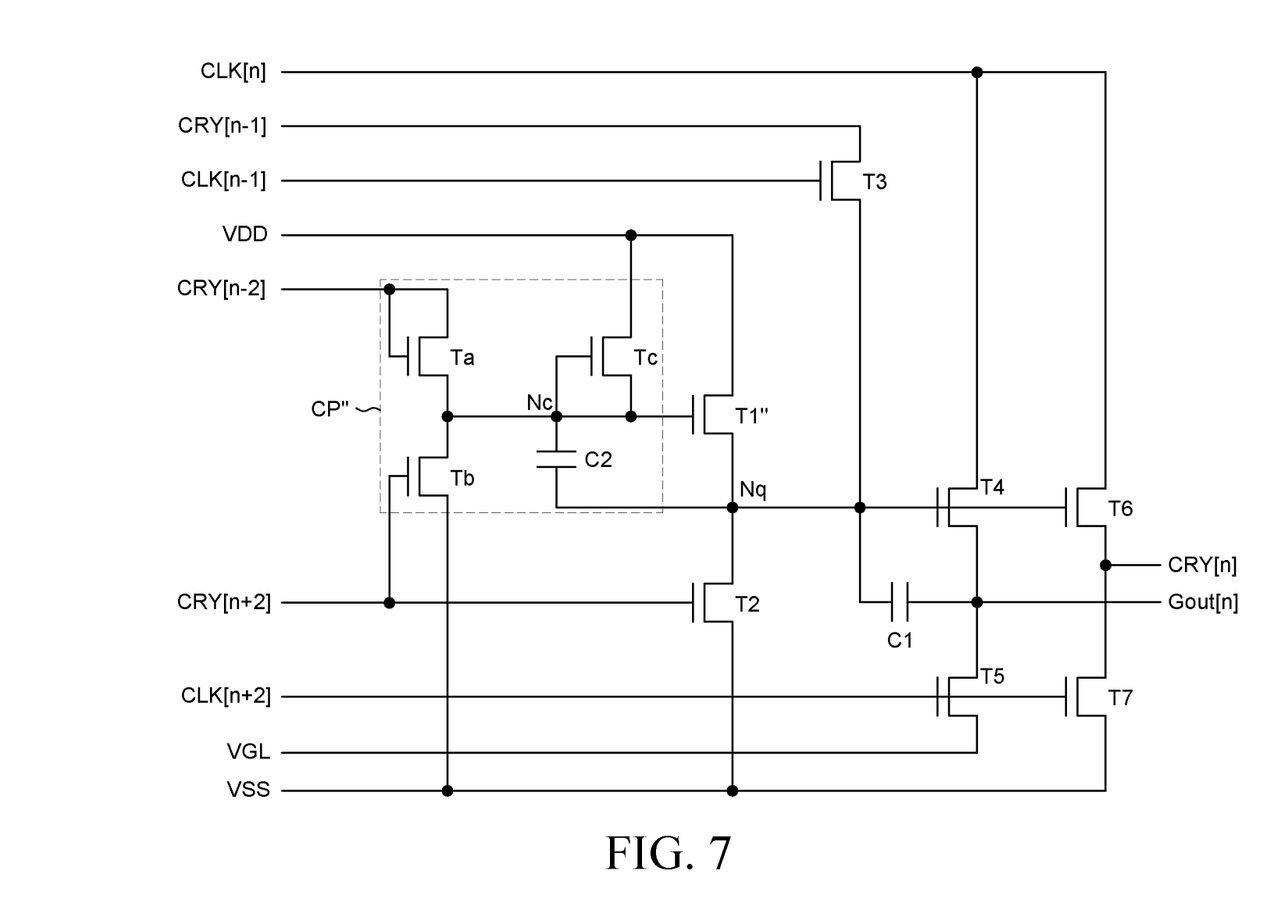
FIG. 7 is a circuit diagram of an N-th stage according to an exemplary embodiment of the present disclosure.

FIG. 7 is a circuit diagram of an N-th stage according to an exemplary embodiment of the present disclosure.

As illustrated in FIG. 7, the N-th stage of the shift register includes a control part CP''', first to seventh transistors T1''', T2 to T7, and a first capacitor C1. The control part CP''' includes a first control transistor Ta, a second control transistor Tb, and a third control transistor Tc. The control part CP''' may further include a second capacitor C2.

The first transistor T1''' is switched in accordance with the potential of the common node Nc which is an output signal of the control part CP''' and charges the Q node Nq with a potential of the high potential voltage terminal VDD. Further, a gate of the first transistor T1''' is connected to the common node Nc, a source is connected to the Q node Nq, and a drain is connected to the high potential voltage terminal VDD.

The second transistor T2 is switched in accordance with the signal of a N+2-th carry output terminal CRY[n+2] and discharges the potential of the Q node Nq to the second low potential voltage terminal VSS. A gate of the second transistor T2 is connected to the N+2-th carry output terminal CRY[n+2], a source is connected to the second low potential voltage terminal VSS, and a drain is connected to the Q node Nq.

A third transistor T3 is switched in accordance with a signal of the N-1-th clock signal terminal CLK[n-1]. The third transistor T3 discharges a potential of the Q node Nq to the N-1-th carry output terminal CRY[n-1] or charges the Q node Nq with the potential of the N-1-th carry output terminal CRY [n-1]. A gate of the third transistor T3 is connected to the N-1-th clock signal terminal CLK[n-1], a source is connected to the N-1-th carry output terminal CRY[n-1], and a drain is connected to the Q node Nq.

A fourth transistor T4 is switched in accordance with a signal of the Q node Nq and charges the N-th stage output terminal Gout[n] with the potential of the N-th clock signal terminal CLK[n]. A gate, a source, and a drain of the fourth transistor T4 are connected to the Q node Nq, an N-th stage output terminal Gout[n], and an N-th clock signal terminal CLK[n], respectively.

A fifth transistor T5 is switched in accordance with a signal of an N+2-th clock signal terminal CLK[n+2] and discharges the N-th stage output terminal Gout[n] to a first low potential voltage terminal VGL. In this case, the potential of the first low potential voltage terminal VGL may be equal to the potential of the low potential voltage terminal VGL illustrated in FIG. 2. A gate, a source, and a drain of the fifth transistor T5 are connected to an N+2-th clock signal terminal CLK[n+2], the first low potential voltage terminal VGL, and the N-th stage output terminal Gout[n], respectively.

A sixth transistor T6 is switched in accordance with a signal of the Q node Nq and charges the N-th carry output terminal CRY[n] with the potential of the N-th clock signal terminal CLK[n]. A gate, a source, and a drain of the sixth transistor T6 are connected to the Q node Nq, an N-th carry output terminal CRY[n], and an N-th clock signal terminal CLK[n], respectively.

A seventh transistor T7 is switched in accordance with a signal of an N+2-th clock signal terminal CLK[n+2] and discharges the N-th carry output terminal CRY[n] to a second low potential voltage terminal VSS. In this case, the potential of the second low potential voltage terminal VSS may be lower than the gate low voltage of the stage output signal. A gate, a source, and a drain of the seventh transistor T7 are connected to an N+2-th clock signal terminal CLK[n+2], the second low potential voltage terminal VSS, and the N-th carry output terminal CRY[n], respectively.

The gates of the fourth transistor T4 and the sixth transistor T6 or the gates of the fifth transistor T5 and the seventh transistor T7 may be connected to each other.

One electrode of a first capacitor C1 is connected to the Q node Nq and the other electrode thereof is connected to the N-th stage output terminal Gout[n]. The first capacitor C1 raises the potential of the Q node Nq during the bootstrap BS period.

During the bootstrap BS period of the Q node Nq, the maximum potential of each of the N-th stage output terminal Gout[n] and the N-th carry output terminal CRY[n] is the gate high voltage VGH. Further, during a period other than the bootstrap BS period including the precharging PC period of the Q node Nq, the N-th stage output terminal Gout[n] is maintained at the signal of the first low potential voltage terminal VGL and the N-th carry output terminal CRY[n] is maintained at the signal of the second low potential voltage terminal VSS.

The rising edge time of the signal of the N-th stage output terminal Gout[n] and the N-th carry output terminal CRY[n] may be shortened by the control part CP''' illustrated in FIG. 7.

The control part CP''' includes a first control transistor Ta, a second control transistor Tb, a third control transistor Tc, and a second capacitor C2.

The first control transistor Ta is switched in accordance with the signal of the N-2-th carry output terminal CRY[n-2] and charges the common node Nc with a potential of the N-2-th carry output terminal CRY[n-2]. The first control transistor Ta may have a diode connection structure in which a gate and a drain are connected to each other. The gate and the drain of the first control transistor Ta is connected to the N−2-th carry output terminal CRY[n−2] and a source of the first control transistor Ta is connected to the common node Nc.

The second control transistor Tb is switched in accordance with the signal of the carry output terminal CRY[n+2] and discharges the common node Nc. A gate, a source, and a drain of the second control transistor Tb are connected to an N+2-th carry output terminal CRY[n+2], the second low potential voltage terminal VSS, and the common node Nc, respectively.

The third control transistor Tc is switched in accordance with the signal of the common node Nc and discharges the common node Nc. The third control transistor Tc may have a diode connection structure in which a gate and a drain are connected to each other. A gate and a drain of the third control transistor Tc are connected to the common node Nc and a source thereof is connected to the high potential voltage terminal VDD.

One electrode of the second capacitor C2 is connected to the common node Nc and the other electrode is connected to the Q node Nq. During the precharging PC period, the potential of the common node Nc may rise by the second capacitor C2 and may be higher than the gate high voltage VGH.

As compared with the shift register illustrated in FIG. 2, the shift register illustrated in FIG. 7 uses the carry output signal instead of the stage output signal, as an input of the shift register. The signal of the N-th stage output terminal Gout[n] is connected to a pixel PXL in an N-th line to drive the transistor which is included in the N-th pixel PXL. In the meantime, the signal of the N-th carry output terminal CRY[n] is not connected to the pixel PXL but is used as an input of the shift register. That is, the signal of the N-th carry output terminal CRY[n] is connected in the shift register.

As described above, the stage output signal is connected to a display area 110A having a large load, so that a slope of a rising edge or a falling edge of the signal may not be steep and the stage output signal may be insensitive to an external noise as compared with the carry signal. In contrast, the carry signal is connected into the shift register which has a relatively small load, so that the slope of the rising edge or the falling edge of the signal is steep, and the stage output signal is sensitive to an external noise as compared with the stage output signal. Therefore, one among the stage output terminal Gout and the carry output terminal CRY may be applied to the shift register according to a target of the output characteristic of the shift register.

In the meantime, the shift register illustrated in FIG. 7 includes a multi low potential voltage terminal. The low potential voltage terminal is divided into two types, as illustrated in FIG. 7, so that a stage output terminal Gout corresponding to the pixel PXL is configured to be connected to the first low potential voltage terminal VGL and the common node Nc or the Q node Nq excluding the stage output terminal Gout may be configured to be connected to the second low potential voltage terminal VSS. The first low potential voltage terminal VGL may be −12 V and the second low potential voltage terminal VSS may be −16 V which is lower than the potential of the first low potential voltage terminal VGL.

The configuration of the shift register illustrated in FIG. 2 or 7 is not limited to the example. For example, the multi low potential voltage terminal or the carry signal illustrated in FIG. 7 may be applied to the shift register illustrated in FIG. 2 in the same way. Specifically, the control part CP illustrated in FIG. 2 may be connected to the carry output terminal CRY instead of the stage output terminal Gout and may also be connected to the second low potential voltage terminal VSS instead of the low potential voltage terminal VGL. Further, the control part CP″ illustrated in FIG. 7 may be connected to the stage output terminal Gout instead of the carry output terminal CRY and may also be connected to the first low potential voltage terminal VGL instead of the second low potential voltage terminal VSS.

In the shift register illustrated in FIGS. 2 and 7, the first transistors T1 and T1″ and the third control transistor Tc are connected to the high potential voltage terminal VDD, but the present disclosure is not limited thereto. For example, the first transistors T1 and T1″ or the third control transistor Tc illustrated in FIGS. 2 and 7 may be connected to the N-th stage output terminal Gout[n] or the N-th carry output terminal CRY[n] connected to the first control transistor Ta, instead of the high potential voltage terminal VDD.

Referring to FIG. 7, the control part CP″ may further include a second capacitor C2. In the first transistor T1″, the gate and the source or the gate and the drain may not overlap with each other or may be spaced apart from each other with a material having a low permittivity therebetween. Therefore, a very small parasitic capacitance Cgs may be formed between the gate and the source of the first transistor T1″. In this case, the coupling effect due to the parasitic capacitance Cgs of the first transistor T1″ is insignificant, so that the potential of the common node Nc may not be affected by the coupling effect during the precharging PC period. Therefore, the control part CP″ illustrated in FIG. 7 may further include a second capacitor C2 to increase the potential of the common node Nc enough during the precharging PC period. In the meantime, a capacitance of the second capacitor C2 may vary depending on a design of the first transistor T1″ and an output characteristic of the shift register, and may be several to several hundred fF (Femto farad).

In the meantime, the control parts CP, CP', and CP″ according to the exemplary embodiment of the present disclosure may reduce the deterioration of the first transistors T1 or T1″. Referring to FIG. 4A, the first transistor T1' is not connected to the control part. If the first transistor T1' is turned off during the bootstrap BS period, a potential difference ΔV1 between the source and the drain is approximately equal to a difference between the potential of the low potential voltage terminal VGL and a potential of the Vq2. In contrast, if the first transistors T1 and T1″ connected to the control part CP, CP', and CP″ are turned off, the potential difference between the source and drain may be reduced to approximately half of ΔV1. FIG. 5B or 6B shows that if the first transistors T1 and T1″ are turned off during the bootstrap BS period, the potential difference ΔV2 between the source and the drain may be approximately a half ΔV1. Therefore, the control parts CP, CP', and CP″ control the potential of the common node Nc to reduce a junction stress of the first transistors T1 and T1″.

The exemplary embodiments of the present disclosure can also be described as below.

In one or more embodiments, a gate driving circuit includes a shift register having a plurality of stages. A stage of the plurality of stages comprises a first transistor configured to charge a first node of the stage with a first voltage level of a high voltage terminal of the stage. The first voltage level is higher than a second voltage level of a low voltage terminal of the stage. The stage further includes a control circuit connected to the first transistor. The control circuit is further connected to the high voltage terminal and to an output terminal of a previous stage of the shift register. The control circuit is configured to control the first transistor to increase a voltage of the first node to be higher than a third voltage level during a first time period. The third voltage level is less than the first voltage level by a threshold voltage of the first transistor.

In one or more embodiments, the first node has a fourth voltage level and a fifth voltage level during the first time period and a second time period after the first time period, respectively. The fourth voltage level is higher than the third voltage level and the fifth voltage level is higher than the fourth voltage level.

In one or more embodiments, the fifth voltage level is a sum of (i) the fourth voltage level and (ii) a difference between the first voltage level and the second voltage level.

In one or more embodiments, the control circuit includes a first control transistor and a second control transistor. The first control transistor, the second control transistor, and the first transistor may be connected to each other by sharing a second node of the stage.

In one or more embodiments, the first control transistor charges the second node in response to an output signal at the output terminal of the previous stage, and the second control transistor discharges the second node in response to an output signal at an output terminal of a subsequent stage of the shift register during a third time period. A voltage of the second node may be higher than the third voltage level, during the first time period.

In one or more embodiments, the control circuit further includes a third control transistor coupled between the high voltage terminal and the second node. The third control transistor is configured to control the second node to turn off the first transistor during a portion of the second time period to reduce discharging of the first node during the portion of the second time period.

In one or more embodiments, the control circuit further includes a first capacitor, where one electrode of the first capacitor is connected to the second node and another electrode of the first capacitor is connected to the first node.

In one or more embodiments, a voltage of the second node during the second time period is equal to or lower than a sum of the first voltage level and a threshold voltage of the third control transistor.

In one or more embodiments, each of the first control transistor and the third control transistor has a diode connection structure.

In one or more embodiments, the stage further includes a pull-up transistor configured to charge an output terminal of the stage in response to the voltage of the first node being the fifth voltage level during the second time period. The stage may further include a second capacitor coupled between the output terminal of the stage and the first node.

One or more embodiments disclosed herein relate to a shift register having a plurality of stages. A stage of the plurality of stages includes a first transistor coupled to a gate line of a display panel. The first transistor includes a gate electrode coupled to a first node of the stage. The stage further includes a second transistor comprising a source electrode coupled to the first node and a gate electrode coupled to a second node of the stage. A first capacitor is coupled between the source electrode and the gate electrode of the second transistor. The second transistor is configured to control a voltage of the first node in response to a voltage of the second node. The control circuit includes a third transistor coupled between the second node and a previous stage of the shift register. The control circuit is configured to receive an output signal of the previous stage of the shift register. The output signal swings between a first voltage level and a second voltage level lower than the first voltage level. The control circuit and the first capacitor together are configured to set the voltage of the second node to be at a fourth voltage level higher than a third voltage level, responsive to receiving the output signal of the previous stage at the first voltage level. The third voltage level is less than the first voltage level by a threshold voltage of the third transistor.

In one or more embodiments, a gate electrode and a drain electrode of the third transistor are coupled to the previous stage to receive the output signal, and a source electrode of the third transistor is coupled to the second node.

In one or more embodiments, the voltage of the second node may be set to be at the fourth voltage level through a capacitive coupling of the first capacitor. The first capacitor may be a parasitic capacitor of the second transistor or a non-parasitic capacitor of the second transistor.

In one or more embodiments, a second capacitor is coupled between the gate electrode of the first transistor and a source electrode of the first transistor. The second transistor may charge the second capacitor to set the voltage of the first node at the fourth voltage level during a first time period. The first transistor and the second capacitor together may increase the voltage of the first node to a fifth voltage level higher than the fourth voltage level during a second time period after the first time period.

In one or more embodiments, the control circuit further includes a fourth transistor having a gate electrode and a drain electrode coupled to the second node and a source electrode coupled to a voltage supply terminal. The fourth transistor may be configured to maintain the voltage of the first node within a range during the second time period.

In one or more embodiments, the first transistor, the second transistor, the third transistor, and the fourth transistor are n-type transistors.

Embodiments disclosed herein relate to a display device including a shift register disclosed herein and a display panel. The display panel includes a plurality of pixels, where each row of the plurality of pixels is coupled to a corresponding gate line.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical spirit of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A shift register having a plurality of stages, a stage of the plurality of stages comprising:
   a first transistor configured to charge a first node of the stage with a first voltage level of a high voltage terminal of the stage, the first voltage level higher than a second voltage level of a low voltage terminal of the stage; and
   a control circuit connected to the first transistor, the high voltage terminal and an output terminal of a previous stage of the shift register, the control circuit configured to control the first transistor to increase a voltage of the first node to be higher than a third voltage level during a first time period, the third voltage level being less than the first voltage level by a threshold voltage of the first transistor,
wherein the control circuit includes a first control transistor, a second control transistor, and a third control transistor;
wherein the first control transistor and the second control transistor are commonly connected to the first transistor; and
wherein a gate electrode and a drain electrode of the third control transistor are commonly connected to the first transistor.

2. The shift register according to claim 1, wherein the first node has a fourth voltage level during the first time period and a fifth voltage level during a second time period after the first time period, respectively, and wherein the fourth voltage level is higher than the third voltage level and the fifth voltage level is higher than the fourth voltage level.

3. The shift register according to claim 2, wherein the fifth voltage level is a sum of (i) the fourth voltage level and (ii) a difference between the first voltage level and the second voltage level.

4. The shift register according to claim 1,
wherein the first control transistor, the second control transistor, and the first transistor are connected to each other by sharing a second node of the stage.

5. The shift register according to claim 4,
wherein the first control transistor charges the second node in response to an output signal at the output terminal of the previous stage, and
wherein the second control transistor discharges the second node in response to an output signal at an output terminal of a subsequent stage of the shift register during a third time period.

6. The shift register according to claim 5, wherein during the first time period, a voltage of the second node is higher than the third voltage level.

7. The shift register according to claim 4, wherein the third control transistor is coupled between the high voltage terminal and the second node, and the third control transistor is configured to control the second node to turn off the first transistor during a portion of a second time period after the first time period to reduce discharging of the first node during the portion of the second time period.

8. The shift register according to claim 7, wherein the control circuit further includes a first capacitor,
one electrode of the first capacitor being connected to the second node and another electrode of the first capacitor being connected to the first node.

9. The shift register according to claim 7, wherein a voltage of the second node during the second time period is equal to or lower than a sum of the first voltage level and a threshold voltage of the third control transistor.

10. The shift register according to claim 7, wherein each of the first control transistor and the third control transistor has a diode connection structure.

11. The shift register according to claim 2, wherein the stage further comprises:
a pull-up transistor configured to charge an output terminal of the stage in response to the voltage of the first node being the fifth voltage level during the second time period.

12. The shift register according to claim 11, further comprising:
a second capacitor coupled between the output terminal of the stage and the first node.

13. A shift register having a plurality of stages, a stage of the plurality of stages comprising:
a first transistor coupled to a gate line of a display panel, the first transistor including a gate electrode coupled to a first node of the stage;
a second transistor comprising a source electrode coupled to the first node and a gate electrode coupled to a second node, the second transistor configured to control a voltage of the first node in response to a voltage of the second node of the stage, a first capacitor coupled between the source electrode and the gate electrode of the second transistor; and
a control circuit comprising a third transistor coupled between the second node and a previous stage of the shift register, the control circuit configured to receive an output signal of the previous stage of the shift register, the output signal of the previous stage of the shift register swinging between a first voltage level and a second voltage level lower than the first voltage level, the control circuit and the first capacitor together configured to set the voltage of the second node to be at a fourth voltage level higher than a third voltage level, responsive to receiving the output signal of the previous stage at the first voltage level, the third voltage level being less than the first voltage level by a threshold voltage of the third transistor.

14. The shift register of claim 13, wherein a gate electrode and a drain electrode of the third transistor are coupled to the previous stage to receive the output signal and a source electrode of the third transistor is coupled to the second node.

15. The shift register of claim 13, wherein the first capacitor is a parasitic capacitor of the second transistor, the voltage of the second node set to be at the fourth voltage level through a capacitive coupling of the first capacitor.

16. The shift register of claim 13, wherein the first capacitor is a non-parasitic capacitor of the second transistor, the voltage of the second node set to be at the fourth voltage level through a capacitive coupling of the first capacitor.

17. The shift register of claim 13, further comprising:
a second capacitor coupled between the gate electrode of the first transistor and a source electrode of the first transistor,
wherein:
the second transistor to charge the second capacitor to set the voltage of the first node at the fourth voltage level during a first time period, and
the first transistor and the second capacitor together to increase the voltage of the first node to a fifth voltage level higher than the fourth voltage level during a second time period after the first time period.

18. The shift register of claim 17, wherein the control circuit further includes a fourth transistor having a gate electrode and a drain electrode coupled to the second node and a source electrode coupled to a voltage supply terminal, the fourth transistor configured to maintain the voltage of the first node within a range during the second time period.

19. The shift register of claim 18, wherein the first transistor, the second transistor, the third transistor, and the fourth transistor are n-type transistors.

20. A display device comprising:
a display panel including a plurality of pixels, each row of the plurality of pixels coupled to a corresponding gate line; and
a shift register including a plurality of stages, a stage of the plurality of stages including:

a first transistor coupled to the corresponding gate line of the display panel, the first transistor including a gate electrode coupled to a first node of the stage, a second transistor comprising a source electrode coupled to the first node and a gate electrode coupled to a second node, the second transistor configured to control a voltage of the first node in response to a voltage of the second node, a first capacitor coupled between the source electrode and the gate electrode of the second transistor, and a control circuit comprising a third transistor coupled between the second node and a previous stage of the shift register, the control circuit configured to receive an output signal of the previous stage of the shift register, the output signal of the previous stage of the shift register swinging between a first voltage level and a second voltage level lower than the first voltage level, the control circuit and the first capacitor together configured to set the voltage of the second node to be at a fourth voltage level higher than a third voltage level, responsive to receiving the output signal of the previous stage at the first voltage level, the third voltage level being less than the first voltage level by a threshold voltage of the third transistor.

* * * * *